United States Patent
Kay et al.

(10) Patent No.: US 8,907,439 B1
(45) Date of Patent: Dec. 9, 2014

(54) FOCAL PLANE ARRAY WITH MODULAR PIXEL ARRAY COMPONENTS FOR SCALABILITY

(75) Inventors: Randolph R. Kay, Albuquerque, NM (US); David V. Campbell, Tijeras, NM (US); Subhash L. Shinde, Albuquerque, NM (US); Jeffrey L. Rienstra, Albuquerque, NM (US); Darwin K. Serkland, Albuquerque, NM (US); Michael L. Holmes, Albuquerque, NM (US); Seethambal S. Mani, Albuquerque, NM (US); Joy M. Barker, Albuquerque, NM (US); Dahwey Chu, Albuquerque, NM (US); Thomas Gurrieri, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 818 days.

(21) Appl. No.: 13/163,909

(22) Filed: Jun. 20, 2011

Related U.S. Application Data

(60) Provisional application No. 61/378,214, filed on Aug. 30, 2010.

(51) Int. Cl.
*H01L 31/12* (2006.01)

(52) U.S. Cl.
USPC .................... 257/432; 257/292; 257/E27.133

(58) Field of Classification Search
CPC ................ H01L 27/14643; H01L 27/14687; H01L 27/14634; H01L 27/14636; H01L 27/14632; H01L 2224/97; H01L 27/1469; H01L 27/146; H01L 2924/14; H01L 23/481; H01L 27/14603; H01L 27/307; H01L 27/14605; H01L 25/0657; H01L 27/14812
USPC .................................... 257/432, 292, 27.133
See application file for complete search history.

(56) References Cited

U.S. PATENT DOCUMENTS

| | | | |
|---|---|---|---|
| 6,452,187 B1 * | 9/2002 | Claiborne et al. | 250/370.12 |
| 6,806,514 B1 * | 10/2004 | Tian et al. | 257/202 |
| 7,335,972 B2 | 2/2008 | Chanchani | |
| 7,745,250 B2 * | 6/2010 | Han | 438/57 |
| 2005/0017315 A1 * | 1/2005 | Hammadou et al. | 257/431 |
| 2008/0309810 A1 * | 12/2008 | Smith et al. | 348/319 |
| 2009/0060409 A1 * | 3/2009 | Karras | 385/2 |
| 2010/0258725 A1 * | 10/2010 | Blackwell, Jr. | 250/332 |
| 2010/0309288 A1 * | 12/2010 | Stettner et al. | 348/43 |

* cited by examiner

*Primary Examiner* — Wael Fahmy
*Assistant Examiner* — Sarah Salerno
(74) *Attorney, Agent, or Firm* — Michael A. Beckett

(57) ABSTRACT

A modular, scalable focal plane array is provided as an array of integrated circuit dice, wherein each die includes a given amount of modular pixel array circuitry. The array of dice effectively multiplies the amount of modular pixel array circuitry to produce a larger pixel array without increasing die size. Desired pixel pitch across the enlarged pixel array is preserved by forming die stacks with each pixel array circuitry die stacked on a separate die that contains the corresponding signal processing circuitry. Techniques for die stack interconnections and die stack placement are implemented to ensure that the desired pixel pitch is preserved across the enlarged pixel array.

11 Claims, 5 Drawing Sheets

US 8,907,439 B1

FOCAL PLANE ARRAY WITH MODULAR PIXEL ARRAY COMPONENTS FOR SCALABILITY

CROSS REFERENCE TO RELATED APPLICATION

This application claims the benefit of U.S. Provisional Patent Application Ser. No. 61/378,214, filed Aug. 30, 2010, and entitled "FOCAL PLANE ARRAY WITH MODULAR PIXEL ARRAY COMPONENTS FOR SCALABILITY", the entirety of which is incorporated herein by reference.

STATEMENT OF GOVERNMENTAL INTEREST

This invention was developed under Contract DE-AC04-94AL85000 between Sandia Corporation and the U.S. Department of Energy. The U.S. Government has certain rights in this invention.

FIELD OF THE INVENTION

The present work relates generally to imaging systems and, more particularly, to focal plane arrays for imaging systems.

BACKGROUND OF THE INVENTION

Imaging systems conventionally contain an array (typically rectangular) of light-sensing pixels located at the focal plane of an optical subsystem 11, as shown in FIG. 1. This array is referred to as a focal plane array (FPA). An increase in the desired field of view (FOV) requires a corresponding increase in the size of the FPA, as shown generally in FIG. 1. The FPA is conventionally provided as an integrated circuit having centrally located pixel array circuitry and peripherally located signal processing circuitry, possibly also mated to a detector layer—the construction and material of which is dependent upon the desired wavelength sensitivity. The size of the FPA may be increased by increasing the size of the integrated circuit die area to accommodate a larger area of pixel array circuitry. However, increasing the die size will ultimately be problematic from a manufacturability standpoint, because the acceptable die yield decreases with increasing die size.

It is desirable in view of the foregoing to provide for larger FPAs while avoiding the aforementioned manufacturability limitations.

DETAILED DESCRIPTION

Exemplary embodiments of the present work provide a modular, scalable FPA as an array of integrated circuit dice, wherein each die includes a given amount of modular pixel array circuitry. By providing an array of the dice, the amount of modular pixel array circuitry is effectively multiplied to produce a larger pixel array while avoiding the aforementioned problem associated with increasing die size. In order to provide a desired pixel pitch across the enlarged pixel array, die stacks are formed such that each pixel array circuitry die is stacked on a separate die that contains the corresponding signal processing circuitry for that pixel array circuitry die. Techniques for die stack interconnections and die stack placement are implemented to ensure that the desired pixel pitch is preserved across the enlarged pixel array.

Figure 2:
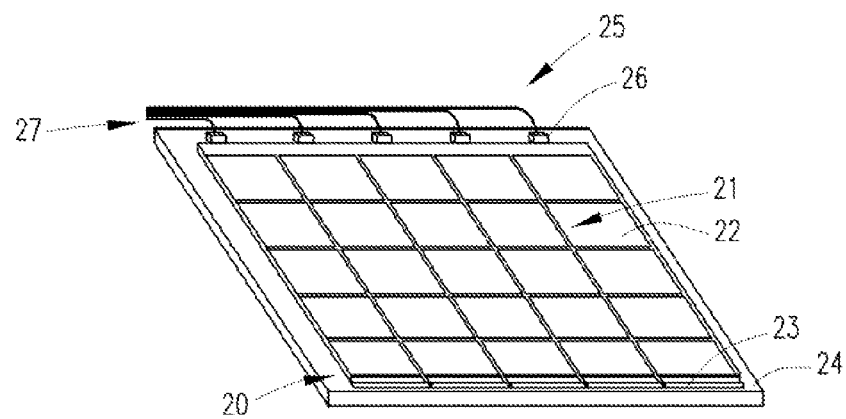
FIG. 2 diagrammatically illustrates a focal plane array according to exemplary embodiments of the present work.

FIG. 2 diagrammatically illustrates a portion of an FPA structure according to exemplary embodiments of the present work. The FPA is constructed with an array 20 of die stacks 21 interposed between a substrate 24 and an image detector (not shown in FIG. 2 for clarity of exposition). Each die stack 21 includes a die 22 that contains pixel array circuitry and overlies another die 23 that contains signal processing circuitry cooperable with the pixel array circuitry. In some embodiments, the pixel array circuitry of die 22 and the signal processing circuitry of die 23 are the same cooperating circuitries as provided on a single conventional FPA integrated circuit die such as described above, and are suitably interconnected with one another to interface in the same fashion as on the conventional FPA die. Advantageously, the die stacks 21 are modular components, and the size of the array 20 may therefore be readily scaled to include as many die stacks 21 as needed to realize an FPA of any desired size.

Figures 3, 4, 5:
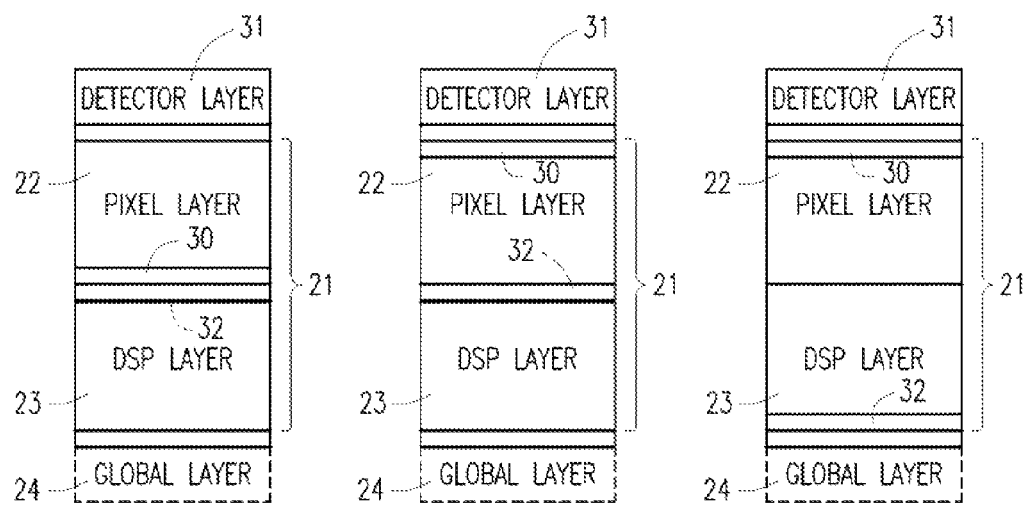
FIGS. 3-5 show respective simplified cross-sectional views of die stacks in the focal plane array of FIG. 2 according to exemplary embodiments of the present work.

FIGS. 3-5 diagrammatically illustrate examples of the die stack structure 21 of FIG. 2 in more detail according to exemplary embodiments of the present work. FIGS. 3-5 also illustrate the substrate 24 (also referred to as the substrate layer) and the image detector 31 (also referred to as the detector layer) between which the die stacks 21 are interposed. Referring also to FIG. 2, the pixel array circuitry dice 22 are seen collectively to define what is referred to as a pixel layer, and the signal processing dice 23 are similarly seen collectively to define a signal processing layer (also referred to as a DSP layer because the processing is primarily digital signal processing).

Integrated circuit processing allows for patterned metallization or contacts on one side of a wafer, namely, the side closest to the silicon surface in which the active devices are fabricated. This side of the wafer is known as the front side (or the face), and the associated metallization contacts are also referred to herein as front side contacts. The opposite side of the wafer is known as the back side (or the back). In the dice 22 and 23 of FIGS. 2-5, interconnection between active devices on the front side and patterned metallization or contacts on the back side is achieved with insulated through-silicon-via (TSV) technology, which is a well known routing and interconnection technique. The resulting metallization contacts on the back side are also referred to herein as back side contacts.

Interconnections between the pixel layer and the DSP layer, and between the DSP layer and the substrate layer 24, are achieved, in some embodiments, using Direct Bond Interconnect or DBI®, a conventional technique commercially available from Ziptronix, Inc., which uses oxide-oxide bonding with embedded metal posts. This bonding technique and others are described in the following US patents, all of which are incorporated herein by reference: U.S. Pat. Nos. 7,126, 212; 7,109,092; 7,041,178; 7,037,755; 6,984,571; 6,962,835; 6,905,557; 6,902,987; 6,867,073; 6,864,585; 6,627,531; and 6,500,694.

Some embodiments use conventional bump bonding to interconnect the detector layer 31 to the pixel layer, more particularly, to either the front side contacts or the back side contacts (depending on the die stack configuration employed) of the pixel layer dice 22. The use of bump bonding to interconnect metalized contacts of an image detector to metalized contacts of an integrated circuit die containing pixel array circuitry is well known in the art.

Various embodiments may employ various die stack configurations, some of which are diagrammatically illustrated in FIGS. 3-5. FIG. 3 shows a face to face configuration wherein the face 30 of the pixel layer die 22 is bonded to the face 32 of the DSP layer die 23, and the backs of the dice 22 and 23 are respectively bonded to the detector and substrate layers 31 and 24. In some embodiments, this configuration uses DBI® for (1) interconnections between front side contacts of the pixel layer die 22 and front side contacts of the DSP layer die 23, and (2) interconnections between back side contacts of the DSP layer die 23 and front side contacts of circuitry (described hereinbelow) in the substrate layer 24. In some embodiments, this configuration uses bump bonding to connect the back side contacts of the pixel layer die 22 to the detector layer 31. The face to face arrangement of FIG. 3 protects the front surfaces of the dice 22 and 23, and also allows for planarization of the back side of the pixel layer die 22, such that a single large area detector array may be attached, as described below relative to FIG. 6. With this approach, the pixel layer die 22 requires edge TSVs, that is, TSVs near the periphery of the die 22, because the TSVs must be aligned to connect with the pixel contacts of the detector layer, some of which are located near the periphery of the die 22.

FIG. 4 shows a face to back configuration wherein the back of the pixel layer die 22 is bonded to the face 32 of the DSP layer die 23, the face 30 of the pixel layer die 22 is bonded to the detector layer 31, and the back of the DSP layer die 23 is bonded to the substrate layer 24. In some embodiments, this configuration uses DBI® for (1) interconnections between back side contacts of the pixel layer die 22 and front side contacts of the DSP layer die 23, and (2) interconnections between back side contacts of the DSP layer die 23 and front side contacts of the substrate layer 24. In some embodiments, this configuration uses bump bonding to connect the front side contacts of the pixel layer die 22 to the detector layer 31. With this approach, the pixel layer die 22 does not require edge TSVs, that is, TSVs near the periphery of the die 22, because the TSVs must be aligned to connect with the front side contacts of the DSP layer die 23, which are located away from the periphery of the die 23.

FIG. 5 shows a back to back configuration wherein the back of the pixel layer die 22 is bonded to the back of the DSP layer die 23, the face 30 of the pixel layer die 22 is bonded to the detector layer 31, and the face 32 of the DSP layer die 23 is bonded to the substrate layer 24. In some embodiments, this configuration uses DBI® for (1) interconnections between back side contacts of the pixel layer die 22 and back side contacts of the DSP layer die 23, and (2) interconnections between front side contacts of the DSP layer die 23 and front side contacts of the substrate layer 24. In some embodiments, this configuration uses bump bonding to connect the front side contacts of the pixel layer die 22 to the detector layer 31. With this approach, the pixel layer die 22 does not require edge TSVs, that is, TSVs near the periphery of the die 22, because the TSVs must be aligned to connect with the back side contacts of the DSP layer die 23, which are located away from the periphery of the die 23.

Figure 6:
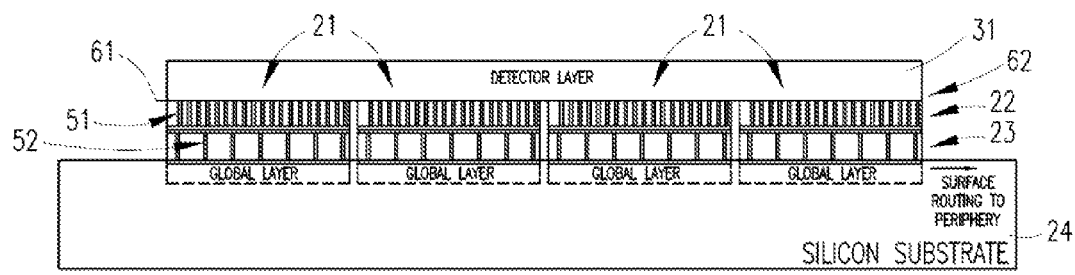
FIG. 6 is a simplified cross-sectional view showing more details of the focal plane array of FIGS. 2 and 3 according to exemplary embodiments of the present work.

FIG. 6 illustrates a more detailed example of the face to face arrangement of FIG. 3. In particular, FIG. 6 shows TSVs 51 provided in the pixel layer dice 22 to connect the pixel array circuitry of the dice 22 to the detector layer 31. Also shown are TSVs 52 provided in the DSP layer dice 23 to connect the signal processing circuitry of the dice 23 to the substrate layer 24. As mentioned above, the face to face arrangement protects the front surfaces of the dice 22 and 23, and also facilitates planarization of the back side of the pixel layer dice 22. The TSVs 51 of the pixel layer dice 22 are exposed after the die stacks 21 are assembled to the substrate layer 24. Manufacturing variations during construction of the die stacks 21 may result in stack-to-stack height variations. Because the active (pixel array) circuitry on the front side of the pixel layer dice 22 faces away from the detector layer 31, only the TSVs 51 are exposed, so the back surfaces of the pixel layer die 22 may be readily planarized using e.g., chemical-mechanical polishing (see the planarization level 61 shown in FIG. 6) before attaching the detector layer 31 (which spans across the multiple die stacks 21) using, e.g., a bump bond connection as shown at 62.

Figure 7:
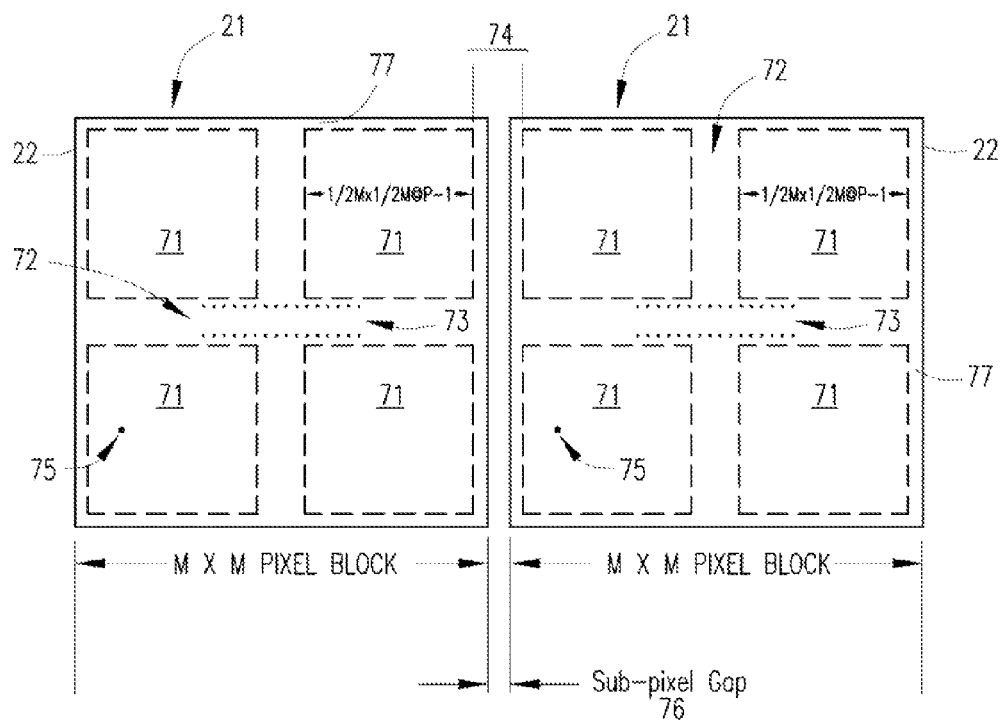
FIG. 7 diagrammatically illustrates circuit topography of pixel layer dice of the focal plane array of FIG. 2 according to exemplary embodiments of the present work.

FIG. 7 diagrammatically illustrates the arrangement of pixel array circuitry on the pixel layer dice 22, and the spatial relationship between pixel layer dice in adjacent die stacks 21, according to exemplary embodiments of the present work. In each pixel layer die 22, the pixel array is partitioned into distinct sub-arrays 71 of pixels (four sub-arrays in the example of FIG. 7). The sub-arrays 71 are physically separated by narrow gaps or streets 72, which are used for placement of routing and TSVs (see 73) as required to connect the sub-arrays 71 to the DSP layer die 23 and the detector layer 31. The pixel size and pitch within the sub-arrays 71 is slightly smaller than the pixel size and pitch on the detector layer. As an example, if the detector layer 31 has a pitch of 30 micrometers, the pitch of the sub-arrays 71 might be set to 29 micrometers. This slight reduction in pitch would allow for the gaps at 72 to occur after every 30th pixel, with a gap width of 30 micrometers.

Also as shown in FIG. 7, some embodiments provide for an inter-die stack spacing 76 between die stacks 21 that is smaller than the pixel width of the pixels 75 in the pixel layer. As explained below, this contributes to a substantially uniform pixel pitch across the entire pixel layer. This small inter-die stack spacing 76 (not shown to scale in FIG. 7) also allows for slight dimensional variations inherent in the singulation of the die stacks 21. In some embodiments, the pixel layer dice 22 are produced with precise lithographically defined and etched die edges that permit patterning the pixel sub-arrays 71 to within only a few (e.g., 10) micrometers of the associated edges of the dice 22. This feature, shown generally as edge spacing 77 (not to scale), in combination with the sub-pixel width inter-die stack spacing 76, permits an "inter-die sub-array spacing" 74 (the spacing between sub-arrays 71 that are adjacent in the pixel layer but located on respectively different dice 22) that is approximately the same as the "intra-die sub-array spacing", i.e., the width of the gaps 72. Note that the inter-die sub-array spacing 74 is equal to the inter-die stack spacing 76 plus twice the edge spacing 77. Given that the inter-die sub-array spacing 74 (not shown to scale in FIG. 7) is approximately equal to the intra-die sub-array spacing 72, this means that any given sub-array 71 is spatially separated from all adjacent sub-arrays 71 (whether on the same die or an adjacent die) by approximately the same distance. Thus, the pixel layer dice 22 (see also 20 in FIG. 2) provide an overall pixel array having a generally uniform pitch (equal to the average pitch of the detector layer 31).

Taking a specific example for illustration, some embodiments provide: a detector layer 31 with a pitch of 30 micrometers; pixel sub-arrays 71 of 30×30 pixels each, at a pitch of 29 micrometers; a gap width at 72 of 30 micrometers; an inter-die stack spacing 76 of 10 micrometers; an edge spacing 77 of 10 micrometers; and an inter-die sub-array spacing 74 of 30 micrometers, that is, the spacing 76 plus twice the spacing 77, or 10+(2×10)=30 micrometers. For this example then, each die 22 contains four 30×30 pixel sub-arrays 71 of 29 micrometer pixels, which collectively constitute a 60×60 block (i.e., M=60 in FIG. 7) of 29-micrometer pixels that is seen to correspond spatially to a 60×60 block of 30-micrometer pixels in the detector layer 31.

In some embodiments, the per-pixel interconnect between a pixel layer die 22 and the detector layer 31 is provided by simply re-patterning slightly the conductive metal routing that extends through the die 22 from the bump bond interface (see, e.g., 62 in FIG. 6) to the pixels on the die (as compared to the routing that would otherwise be employed in a pixel layer die having the same pitch as the detector layer).

Referring again to FIGS. 2-6, the global layer circuitry in the substrate 24 provides interfacing between the DSP layer and an interface 25 provided on the substrate and configured to carry data (e.g., information associated with captured images) provided by the DSP layer to a digital processing arrangement located externally of the FPA. As shown in FIG. 2, some embodiments provide the interface 25 as a conventional electro-optical interface including fiber optic transmitters 26 and associated optical transmission fibers 27. The fiber optic transmitters 26 produce optical signals for transmission on the optical fibers 27. Some embodiments provide each fiber optic transmitter 26 as a Vertical Cavity Surface Emitting Laser (VCSEL). The use of an electro-optical interface such as shown at 25 permits transferring relatively large amounts of data at relatively high sampling rates, thereby enabling better exploitation of the increased size of an FPA such as described with respect to FIGS. 2-7.

In some embodiments, the global layer circuitry includes active interfacing circuitry that receives data from the DSP layer and processes/formats the data appropriately for input to the fiber optic transmitters 26. Such active circuitry typically has relatively low feature density, so relatively high manufacturing yield may be maintained even though the substrate 24 is a large (e.g., six inch) wafer in some embodiments. The substrate 24 is SiC (silicon carbide) in some embodiments, which has a CTE (coefficient of thermal expansion) matched to silicon, high thermal conductivity, high mechanical strength, is optically flat, and is highly chemically inert. Such a substrate has the advantage of providing adequate mechanical interfacing strength. In some embodiments, the substrate 24 has a thickness of approximately 500 micrometers.

Some embodiments construct and place the die stacks 21 of FIG. 2 according to the following procedure. A wafer of pixel layer dice 22, also referred to as a pixel layer wafer 88 (see FIG. 8), and a wafer of the corresponding DSP layer dice 23, also referred to as a DSP layer wafer 89 (see FIG. 8) are produced according to conventional techniques. A final via layer is added to each wafer to bring the necessary interface signals to the surface of the wafer in a manner consistent with DBI® processing. Some embodiments apply temporary test metallization pads to each wafer to allow probe functional test of the dice and establish locations of functional dice within the each wafer. The dice are suitably positioned on the respective wafers 88 and 89 to facilitate bonding the wafers together with the pixel layer dice 22 stacked on the respective DSP layer dice 23, for example, in one of the configurations described above relative to FIGS. 3-5. As described above, some embodiments use conventional DBI® bonding to interconnect the pixel layer dice 22 to the respective DSP layer dice 23. The result is a wafer stack including the pixel layer wafer 88 and the DSP layer wafer 89. (This wafer stack structure can be seen at 87 in FIG. 8.)

Some embodiments determine locations of known-good-die on the wafers 88 and 89 by conventional wafer level probe test using the aforementioned test pads. Knowledge of these good die locations may be used to pair wafers 88 and 89 such that stacking of known-good pixel layer dice on known-good DSP dice is maximized, thus providing for maximum die stack yield.

Figure 8:
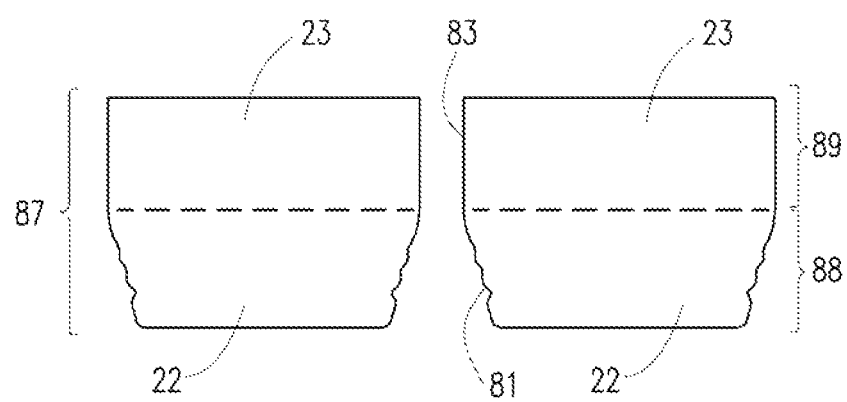
FIG. 8 diagrammatically illustrates singulation of die stacks such as shown in FIG. 6 according to exemplary embodiments of the present work.

Next, the wafer stack 87 is thinned from the side of the DSP layer wafer 89 (using, e.g., conventional chemical-mechanical polishing) to reveal the TSV contacts. Some embodiments apply temporary test metal so that the wafer stack 87 can be probe tested in conventional fashion to establish locations of known good stacks for assembly of the FPA. After thinning from the DSP wafer side, the die stacks 21 are singulated from the wafer stack 87. The singulation process is described for the example of the face to face configuration of FIG. 3, wherein the front side contacts of the pixel layer dice 22 bonded to the front side contacts of the DSP layer dice 23 via DBI® bonding. As shown in FIG. 8, Bosch etching is applied from the previously thinned surface of the DSP layer wafer 89 to create "trenches" that extend completely through the DSP layer wafer 89 and into the pixel layer wafer 88. FIG. 8 shows such a trench at 83. Next, a set of saw cuts are made from the pixel layer side of the wafer stack 87. As shown generally at 81, these saw cuts extend through the pixel layer wafer 88 just deep enough to meet the Bosch etch trenches 83 such that the die stacks are completely singulated. The Bosch etch trenches 83 form the aforementioned precise edges on the pixel layer dice 22 (described above relative to FIG. 7). The DBI® bonding region is shown by broken line in FIG. 8.

Figure 9:
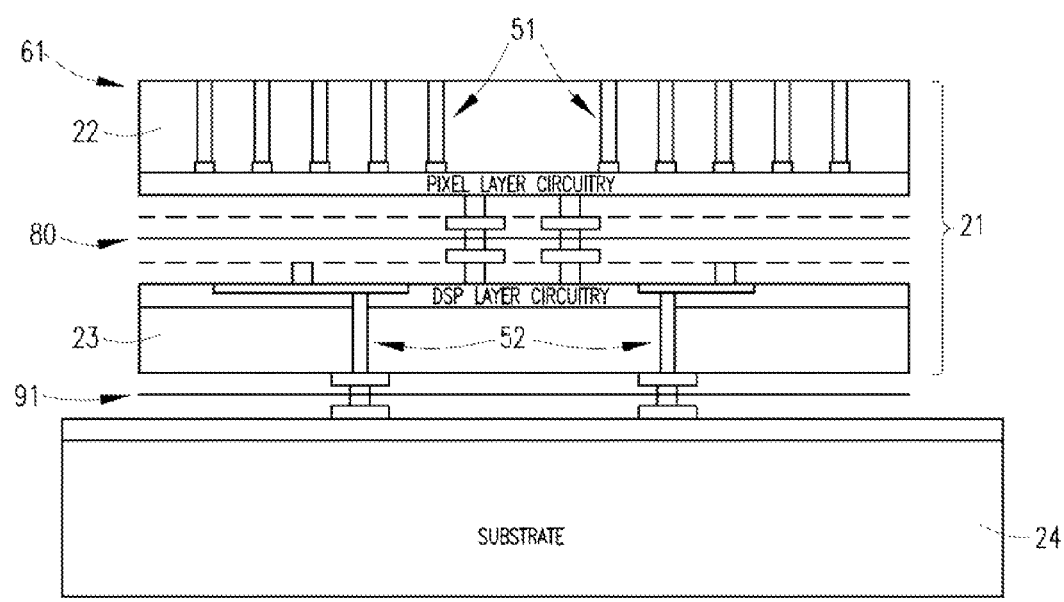
FIG. 9 shows more details of die stacks such as shown in FIGS. 3 and 6.

The die stacks that have passed the aforementioned wafer level testing are then mounted on the substrate 24, as shown in FIG. 9 (with appropriate inter-die stack spacing 76 as described above). As described above, some embodiments use conventional DBI® bonding, shown diagrammatically at 91, to connect the back side contacts of the DSP layer dice 23 to the front side contacts of the associated global layer circuitry on the substrate 24. The pixel layer dice 22 are then planarized as described above (see planarization level 61 in FIGS. 6 and 9). Thereafter, and referring also to FIGS. 3 and 6, the detector layer 31 is bonded to the back side contacts of the pixel layer dice 22 using, for example, conventional bump bonding.

Figure 1:
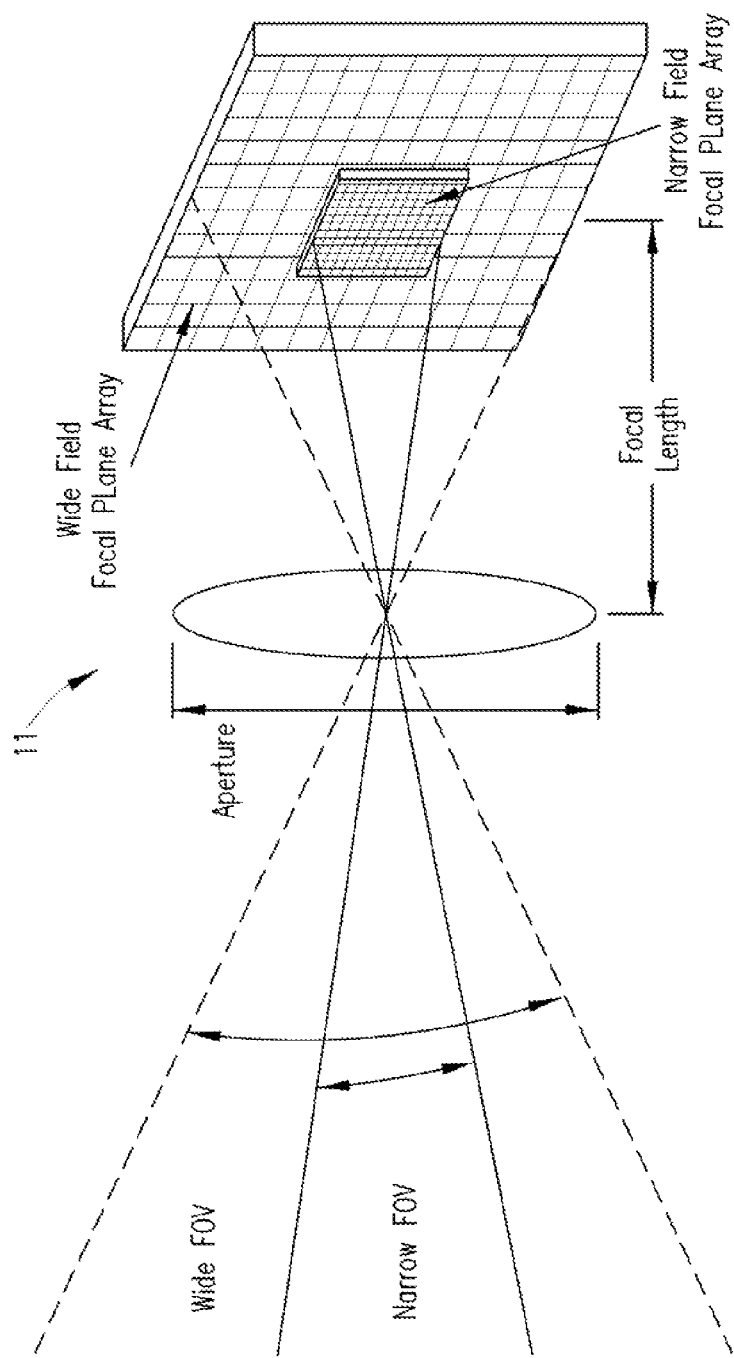
FIG. 1 diagrammatically illustrates an imaging system according to the prior art.

In some embodiments, the detector layer 31 of FIGS. 3-6 may have the same conventional structure as the detector layer mentioned above with respect to FIG. 1. On the other hand, some embodiments provide the detector layer 31 as a plurality of separate detector layer portions respectively bump bonded to the pixel layer dice 22 of the individual die stacks 21, thereby also exploiting in the detector layer 31 the above-described modularity and scalability of the DSP and pixel layers. Similarly, some embodiments provide at least some portion of the global layer circuitry of FIGS. 3-6 as a plurality of separate global layer circuitry portions respectively bonded to the DSP layer dice 23 of the individual die stacks 21, thereby also exploiting in the substrate layer 24 the above-described modularity and scalability of the DSP and pixel layers.

Although exemplary embodiments of the present work are described above in detail, this does not limit the scope of the present work, which can be practiced in a variety of embodiments.

What is claimed is:

1. A focal plane array apparatus comprising:
a substrate;
a plurality of die stacks mounted on said substrate, each said die stack including a first integrated circuit die and a second integrated circuit die interposed between said first die and said substrate, said first die containing an array of pixels, and said second die containing signal processing circuitry coupled to said array of pixels and said substrate; and
an image detector mounted on said die stacks adjacent said first dice, said image detector containing a further array of further pixels, each said array of pixels coupled to said further array of further pixels, wherein said pixels have a first common pixel width and said further pixels have a second common pixel width that is greater than said first common pixel width, wherein said first die includes a plurality of sub-array portions of said array of pixels, and a gap area that is devoid of pixels and separates said sub-array portions from one another, wherein said gap area separates said sub-array portions from one another by a distance approximately equal to said first common pixel width, wherein said die stacks are separated from one another on said substrate by a distance that is less than said first common pixel width, and wherein, in said first die, some of said sub-array portions are separated from a peripheral edge of said first die by a distance that is less than said first common pixel width, and
wherein said apparatus includes a routing structure for coupling said array of pixels to one of said signal processing circuitry and said further array of further pixels, and wherein said routing structure extends through said gap area.

2. The apparatus of claim 1, wherein said die stacks are arranged on said substrate in a rectangular array.

3. The apparatus of claim 1, wherein said substrate is configured to interface between said signal processing circuitry and a destination external to said apparatus.

4. The apparatus of claim 3, wherein said substrate includes an electro-optical interface configured to transfer to the external destination imaging information provided by said signal processing circuitry.

5. The apparatus of claim 4, wherein said electro-optical interface includes a fiber optic transmitter and an optical transmission fiber coupled to said fiber optic transmitter.

6. The apparatus of claim 5, wherein said fiber optic transmitter is a vertical cavity surface emitting laser.

7. The apparatus of claim 1, wherein, in each said die stack, said pixel array and said signal processing circuitry are provided at respective front sides of said first die and said second die, and said front sides face one another.

8. The apparatus of claim 1, wherein, in each said die stack, said pixel array and said signal processing circuitry are provided at respective front sides of said first die and said second die, and one said front side faces away from the other said front side.

9. The apparatus of claim 1, wherein, in each said die stack, said pixel array and said signal processing circuitry are provided at respective front sides of said first die and said second die, and said front sides face away from one another.

10. An imaging system comprising:
an optical subsystem for focusing images at a focal plane; and
a focal plane array positioned at said focal plane and configured to capture said images, said focal plane array including:
a substrate;
a plurality of die stacks mounted on said substrate, each said die stack including a first integrated circuit die and a second integrated circuit die interposed between said first die and said substrate, said first die containing an array of pixels, and said second die containing signal processing circuitry coupled to said array of pixels; and
an image detector mounted on said die stacks adjacent said first dice, said image detector containing a further array of further pixels, each said array of pixels coupled to said further array of further pixels, wherein said pixels have a first common pixel width and said further pixels have a second common pixel width that is greater than said first common pixel width, wherein said first die includes a plurality of sub-array portions of said array of pixels, and a gap area that is devoid of pixels and separates said sub-array portions from one another, wherein said gap area separates said sub-array portions from one another by a distance approximately equal to said first common pixel width, wherein said die stacks are separated from one another on said substrate by a distance that is less than said first common pixel width, and wherein, in said first die, some of said sub-array portions are separated from a peripheral edge of said first die by a distance that is less than said first common pixel width, and
wherein said focal plane array includes a routing structure for coupling said array of pixels to one of said signal processing circuitry and said further array of further pixels, and wherein said routing structure extends through said gap area.

11. An integrated circuit apparatus comprising:
a first integrated circuit die containing an array of pixels that each have a common pixel width, said array of pixels separated from a peripheral edge of said first die by a distance that is less than said common pixel width; and
a second integrated circuit die containing signal processing circuitry coupled to said array of pixels, said second die adapted for coupling to a substrate;
wherein said first die is mounted in overlying relationship relative to said second die to form a stacked structure, wherein said pixels have a first common pixel width and said further pixels have a second common pixel width that is greater than said first common pixel width, wherein said first die includes a plurality of sub-array portions of said array of pixels, and a gap area that is devoid of pixels and separates said sub-array portions from one another, wherein said gap area separates said sub-array portions from one another by a distance approximately equal to said first common pixel width, wherein said die stacks are separated from one another on said substrate by a distance that is less than said first common pixel width, and wherein, in said first die, some of said sub-array portions are separated from a peripheral edge of said first die by a distance that is less than said first common pixel width, and
wherein said apparatus includes a routing structure for coupling said array of pixels to one of said signal processing circuitry and said further array of further pixels, and wherein said routing structure extends through said gap area.

\* \* \* \* \*